United States Patent [19]

Nakazawa et al.

[11] Patent Number: 4,720,651

[45] Date of Patent: Jan. 19, 1988

[54] RESONATOR INSENSITIVE TO PARAXIAL ACCELERATIONS

[75] Inventors: Mitsuo Nakazawa, Nagano, Japan; Arthur Ballato, Long Branch, N.J.

[73] Assignee: The United States of America as represented by the Secretary of the Army, Washington, D.C.

[21] Appl. No.: 597,326

[22] Filed: Apr. 6, 1984

Related U.S. Application Data

[63] Continuation of Ser. No. 386,863, Jun. 10, 1982, abandoned.

[51] Int. Cl.⁴ .............................. H01L 41/08
[52] U.S. Cl. .................... 310/369; 310/335; 310/367
[58] Field of Search ............ 310/367, 369, 334–337

[56] References Cited

U.S. PATENT DOCUMENTS

| | | | |
|---|---|---|---|
| 3,694,677 | 9/1972 | Guttwein | 310/369 |
| 3,968,680 | 7/1976 | Uopilkin et al. | 310/369 X |
| 4,097,835 | 6/1978 | Green | 310/369 X |
| 4,135,108 | 1/1979 | Besson | 310/369 X |
| 4,184,094 | 1/1980 | Kopel | 310/369 X |
| 4,317,059 | 2/1982 | Besson | 310/369 X |

*Primary Examiner*—Mark O. Budd
*Attorney, Agent, or Firm*—Sheldon Kanars; Jeremiah G. Murray; Edward Goldberg

[57] ABSTRACT

A ring-supported quartz crystal resonator having a circular peripheral support region encircling an inner resonator region which is configured in the form of a domed arch wherein the top and bottom surfaces thereof are, respectively, convex and concave. In one embodiment the radius of curvature of the convex and concave top and bottom surfaces are substantially equal so that an arch of substantially uniform thickness is provided. In a second embodiment, the convex and concave top and bottom surfaces have different radii of curvature and, more particularly, the radius of curvature of the top surface is less than the radius of curvature of the bottom surfaces whereby a thickness of the inner region gradually increases uniformly toward the center. Such structures exhibit low resistance and improved mode spectrum.

10 Claims, 3 Drawing Figures

$R_1 = R_2$
$Y_0 = Y_0'$ $R_1 < R_2$
$Y_0 < Y_0'$

RESONATOR INSENSITIVE TO PARAXIAL ACCELERATIONS

The invention described herein may be manufactured and used by or for the Government for governmental purposes without the payment of any royalties thereon or therefor.

This application is a continuation of application Ser. No. 386,863, filed June 10, 1982 now abandoned.

BACKGROUND OF THE INVENTION

This invention relates to the field of piezoelectric resonators and more particularly to quartz crystal resonators that are highly insensitive to paraxial accelerations.

Frequency perturbations are produced in thickness mode crystal resonators by acceleration-induced forces acting on the body of the resonator. These forces are distributed throughout the resonator volume and vary with the acceleration direction. For specific acceleration directions, the effect can be sharply reduced by changing the points of application of the mounting supports. When the acceleration direction is known in advance, positioning the resonator with respect to the direction minimizes the problem. In high shock and vibration environments, however, accelerations occur in arbitrary directions with ensuing large frequency shifts in the crystal resonance frequency. When the acceleration is arbitrarily oriented with respect to the resonator, no crystal cut or combination of mounting supports can by themselves produce cancellations of the frequency perturbations to the extent required.

In an article entitled, "Crystal Resonators with Increased Immunity to Acceleration Fields" authored by Arthur Ballato and appearing in the IEEE Transactions on Sonics and Ultrasonics, Vol. SU-27, No. 4, July, 1980, pp. 195–201, a comparison is made between conventional and ring-supported plate-type crystal resonators with a showing of the effects of out-of-plane acceleration on each. As stated therein, the conventional resonator is subjected to simply supported boundary conditions at its edges while the ring-supported resonator has double cantilever edge boundary conditions. Since frequency shift is proportional to deformation at the center of the plate, it is shown to be less for a ring-supported structure. Also when the acceleration is in the plane of the plate, one cannot predict the magnitude of the effect of acceleration except that it will depend on the azimuth angle of the acceleration field. The improvement provided by the ring-supported resonator lends itself to crystals of any type of cut, typical examples being the AT cut and the SC cut, which are well known to those skilled in the art. While the above comparison was made with a bi-plano structure, crystal resonators configured as plano-convex or bi-convex forms were noted to be suitable alternatives.

SUMMARY

It is an object of the present invention, therefore, to provide an improvement in piezoelectric resonators.

It is a further object of the present invention to provide an improvement in quartz crystal resonators that are highly insensitive to paraxial accelerations.

It is yet another object of the present invention to provide an improvement in ring-supported resonators having an improved frequency-acceleration characteristic.

It is yet another object of the present invention to provide a ring-supported quartz crystal resonator which is extremely insensitive to acceleration forces along a single direction or axis.

Briefly, the foregoing and other objects of the present invention are accomplished by means of a ring-supported piezoelectric resonator, preferably of quartz having an AT cut or an SC cut. The resonator is configured to have an inner region in the form of a circular dome having an arch-type central portion surrounded by a ring-supported periphery of constant thickness. The central portion includes mutually opposing top and bottom surfaces which are respectively convex and concave, thereby providing a structure which is extremely insensitive to paraxial acceleration forces. While the thickness of the central arch portion may be substantially constant, it is preferably thicker at the middle as opposed to the outer edge adjacent the ring-supported periphery to provide energy trapping.

DESCRIPTION OF THE PREFERRED EMBODIMENTS

Quartz crystal resonators of conventional or known prior art construction are, as noted above, sensitive to acceleration fields. The usual number attached to this sensitivity is one or two parts in $10^9$ per g where g is the unit of earth's gravity. Modern applications, particularly military applications such as use in helicopters, tanks, smart munitions and the like, now require one or more factors of ten improvement over this traditional figure. As is well known, ring-supported resonators exhibit superior frequency insensitivity for fields in the direction of the crystal plate thickness. In an effort to provide piezoelectric resonators for stable oscillators that are subjected to acceleration fields that are applied largely or substantially along a single direction or axis, commonly referred to as paraxial accelerations, the invention is directed to an improvement in such devices that will produce extremely small deformations and hence very little frequency change.

Figure 1:
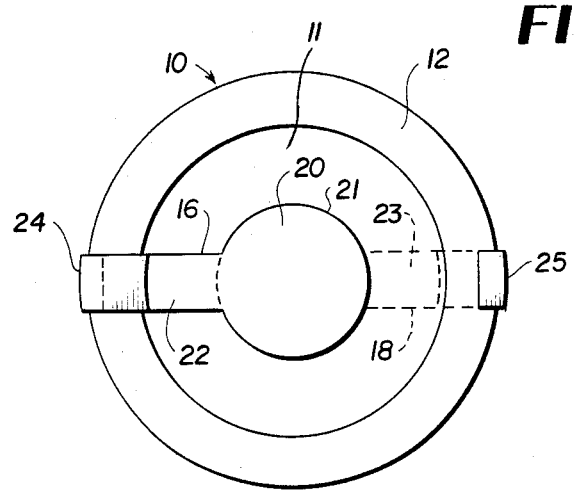
FIG. 1 is a top planar view of a ring-supported crystal resonator.

Referring now to the drawings and more particularly to FIG. 1, there is disclosed a generally circular monolithic body 10 of piezoelectric material, such as quartz, whose orientation of cut is preferably AT or SC and which includes a central circular region 11 and an outer circular ring-support region 12 which is mounted in a holder, not shown. Such a holder is of a well-known type, a typical example being a flat pack resonator package shown and described, for example, in U.S. Pat. No. 3,931,388, entitled, "Crystal Resonator Housing Configuration", which issued to Erich Hafner, et al. on Jan. 6, 1976.

Figure 2:
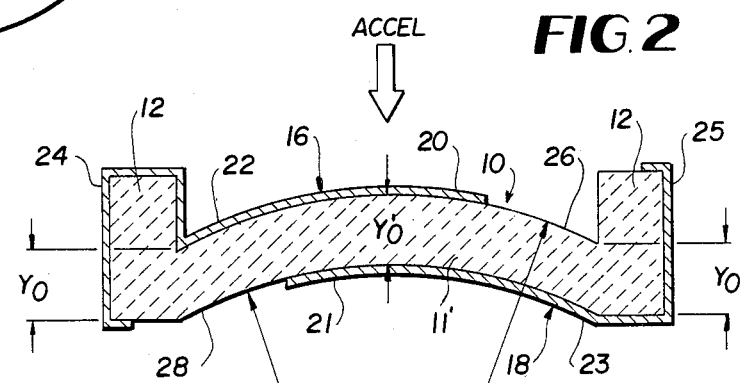
FIG. 2 is a central transverse cross section of a first embodiment of the subject invention.
Figure 3:
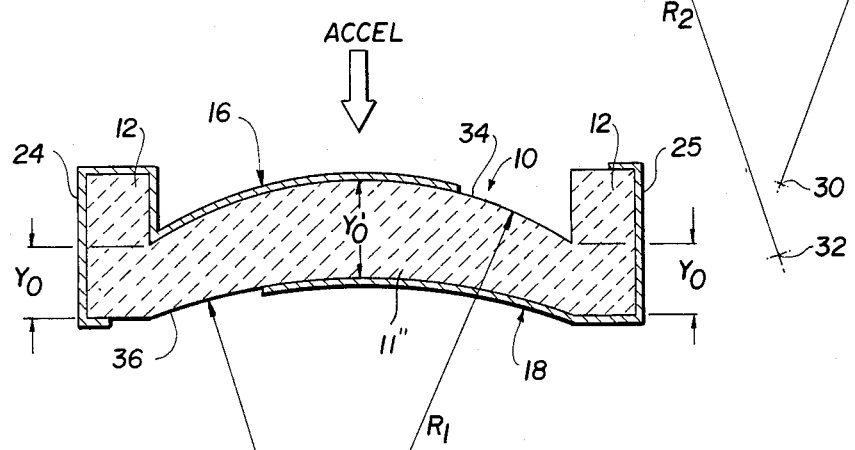
FIG. 3 is a central transverse cross section of a second and preferred embodiment of the subject invention.

In order to energize the quartz crystal resonator of FIG. 1, electrode means are applied to the top and bottom surfaces of the resonator body 10. The electrode means are comprised of upper and lower metallized contact areas 16 and 18, which are substantially identical in configuration. As shown in FIG. 1, the top electrode 16 is comprised of a central circular area of metallization 20 having a linear tab 22 which extends to the left periphery of the outer support region 12 where it terminates in an area of metallization 24 which extends down over the outer edge of the support region 12 to the underside thereof as shown in FIGS. 2 and 3. In a like manner, the electrode 18 includes a circular area 21 located on the undersurface of the body 10 in direct opposition to the circular area of metallization 20. A linear tab 23 extends to the right edge of the outer support region 12 terminating in a metallized member 25 which extends from the underside of the body 10 up the outer edge of the periphery and overlapping the upper surface of the outer support region 12. While this configuration is typically illustrative of known ring-supported resonators it is also applicable to the embodiments of the invention, now to be described.

Referring now to the embodiments disclosed in FIGS. 2 and 3, the invention is directed to a monolithic piezoelectric resonator body 10 having a central resonator region 11' and 11'', respectively, whose cross section defines an arch so that where, for example, a circular resonator configuration as shown in FIG. 1 is utilized, a domed structure is provided, which if oriented in the direction of an acceleration force, as shown, will produce extremely small deformations and hence very little frequency change. Such a resonator structure is additionally inherently strong against breakage in the direction of the acceleration field due to the great strength realized as a consequence of the principle of the distribution of forces by means of an arch.

Referring specifically now to the embodiment shown in FIG. 2, shown therein is a convex-concave quartz resonator structure having an arch-type inner region 11', whose convex upper face 26 includes the metallization pattern for the electrode means 16 shown in FIG. 1 while the concave lower face 28 includes the metallization for electrode means 18 shown in FIG. 1. The inner region 11' is circular in configuration and terminates in a ring-shaped peripheral region 12 having a height which is substantially greater than the thickness dimension $Y_0$ which is the thickness of the inner resonator region 11' where it meets the peripheral region 12. What is significant about the embodiment shown in FIG. 2 is that the thickness of the resonator region 11' is substantially constant from the edge dimension $Y_0$ to the central thickness dimension $Y'_0$, meaning that $Y_0 = Y'_0$. Accordingly, the radii of curvature $R_1$ and $R_2$ of the top and bottom surfaces 26 and 28 are substantially equal. Moreover, as shown in FIG. 2, the centers 30 and 32 for the radii $R_1$ and $R_2$ are displaced along the central axis of the resonator which is also the point and direction along which the acceleration field is applied. Such a configuration is adapted to provide a relatively low resistance and improved frequency mode spectrum.

A further improvement of this type of arch-type resonator is shown by the embodiment of FIG. 3 wherein a circular piezoelectric ring-supported resonator structure such as shown in FIG. 1 includes a domed shaped inner resonator region 11'' whose thickness gradually increases from the ring supported periphery 12 as indicated by the dimension $Y_0$ to the center as indicated by the dimension $Y'_0$, i.e. $Y_0 < Y'_0$. This results from the upper surface 34 having a radius of curvature $R_1$ which is less than the radius of curvature $R_2$ of the lower surface 36. This type of configuration will provide still further resistance to a centrally applied acceleration force as shown and accordingly will undergo extremely small deformations and hence very little frequency change with respect to the paraxial force applied to the upper surface 34 of the resonator. Furthermore, this configuration is adapted to provide energy trapping which will cause the resonator to exhibit even lower resistance and a better mode spectrum over known prior art resonator structures.

Thus for applications where the direction of the acceleration force is known, the present invention provides a resonator configuration that is not only insensitive against very high acceleration levels, but also exhibits extreme insensitivity to frequency changes with respect to the magnitude of the acceleration.

Having thus shown and described what is at present considered to be the preferred embodiments of the subject invention, it should be understood that the foregoing detailed description has been made by way of illustration and not limitation and accordingly all changes, modifications and alterations coming within the spirit and scope of the invention are herein meant to be included.

1. A piezoelectric resonator comprising a monolithic circular body of piezoelectric material having a curved inner resonator region including top and bottom surfaces which are respectively convex and concave about a central longitudinal axis, an outer peripheral support region in the form of a circular ring having upper and lower surfaces, the height of said peripheral ring between said upper and lower surfaces extending from the lowermost bottom surface of the adjacent inner region to above the uppermost top convex central surface of said inner region for supporting said inner region in a space within said peripheral ring, said space having a height corresponding to said height of said ring between said upper and lower ring surfaces and being substantially unoccupied directly above and below said top and bottom curved surfaces, said curved inner region being resistant to acceleration forces applied in the direction of said central longitudinal axis, and including a pair of opposing electrodes on the upper and lower surfaces and on the outer side surfaces of said peripheral ring, one electrode extending along an inner side surface of said ring and onto an upper curved surface portion of said inner region from one side of said ring and the other electrode extending along a bottom curved surface portion of said inner region from the opposite side of said ring, the electrode portions of said inner region surfaces being substantially included therewith in said space within said ring.

2. The resonator as defined by claim 1 wherein the radius of curvature of said top and bottom surfaces of said inner resonator region are substantially equal.

3. The resonator as defined by claim 1 wherein the radius of curvature of said top and bottom surfaces of said inner resonator region are unequal.

4. The resonator as defined by claim 3 wherein the radius of curvature of said top surface is less than the radius of curvature of said bottom surface.

5. The resonator as defined by claim 2 wherein the thickness of said inner resonator region including said convex and concave top and bottom surfaces is substantially constant from said circular peripheral region to the center of said inner region.

6. The resonator as defined by claim 3 wherein the thickness of said inner resonator region gradually increases from the circular peripheral region to the center of said inner region.

7. The resonator as defined by claim 3 wherein the radius of curvature of said top surface of said inner portion is less than the radius of curvature of said bottom surface whereby the thickness of said inner resonator region gradually increases uniformly from said circular peripheral region to the middle of said inner region providing thereby a resonator having an arch which is adapted to render the resonator highly insensitive to paraxial accelerations and which provides an improved resonance mode spectrum due to energy trapping.

8. The resonator as defined by claim 1 wherein said monolithic body is comprised of quartz.

9. The resonator as defined by claim 1 wherein said monolithic body is comprised of quartz having an AT cut.

10. The resonator as defined by claim 1 wherein said monolithic body is comprised of quartz having an SC cut.

* * * * *